United States Patent
Edelstein et al.

(10) Patent No.: US 6,779,711 B2
(45) Date of Patent: Aug. 24, 2004

(54) SELF-ALIGNED CORROSION STOP FOR COPPER C4 AND WIREBOND

(75) Inventors: Daniel C. Edelstein, New Rochelle, NY (US); Anthony K. Stamper, Williston, VT (US); Judith M. Rubino, Ossining, NY (US); Carlos J. Sambucetti, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/180,777

(22) Filed: Jun. 25, 2002

(65) Prior Publication Data

US 2003/0072928 A1 Apr. 17, 2003

Related U.S. Application Data

(62) Division of application No. 09/311,973, filed on May 14, 1999, now Pat. No. 6,457,234.

(51) Int. Cl.$^7$ .......................... B23K 1/20; B23K 31/02; B23K 5/22
(52) U.S. Cl. .................................... 228/180.1; 228/209
(58) Field of Search .......................... 228/108.1–180.5, 228/203, 208, 209, 259

(56) References Cited

U.S. PATENT DOCUMENTS

| | | | | |
|---|---|---|---|---|
| 3,162,512 A | * | 12/1964 | Robinson | 428/670 |
| 4,424,241 A | * | 1/1984 | Abys | 427/443.1 |
| 4,863,766 A | * | 9/1989 | Iacovangelo et al. | 427/443.1 |
| 5,133,495 A | | 7/1992 | Angulas et al. | |
| 5,184,206 A | | 2/1993 | Neugebauer et al. | |
| 5,206,186 A | | 4/1993 | Neugebauer et al. | |
| 5,212,138 A | * | 5/1993 | Krulik et al. | 502/230 |
| 5,236,873 A | * | 8/1993 | Anceau et al. | 438/113 |
| 5,272,111 A | * | 12/1993 | Kosaki | 438/614 |
| 5,447,599 A | | 9/1995 | Li et al. | |
| 5,447,887 A | | 9/1995 | Filipiak et al. | |
| 5,656,860 A | | 8/1997 | Lee | |
| 5,723,387 A | * | 3/1998 | Chen | 438/692 |
| 5,925,930 A | * | 7/1999 | Farnworth et al. | 257/737 |
| 6,057,223 A | | 5/2000 | Lanford et al. | |
| 6,159,769 A | * | 12/2000 | Farnworth et al. | 438/108 |
| 6,261,637 B1 | * | 7/2001 | Oberle | 427/304 |
| 6,271,056 B1 | * | 8/2001 | Farnworth et al. | 438/106 |
| 6,506,672 B1 | * | 1/2003 | Dagenais et al. | 438/612 |

OTHER PUBLICATIONS

Metallographic Etching, Gunter Petzow, 1978, pp. 43, 50, 85, 88.

* cited by examiner

Primary Examiner—Stanley S. Silverman
Assistant Examiner—Colleen P. Cooke
(74) Attorney, Agent, or Firm—Schmeiser, Olsen & Watts; William D. Sabo

(57) ABSTRACT

A self-aligned process for fabricating a corrosion-resistant conductive pad on a substrate, and a structure that includes an interconnect to allow a terminal connection to the pad. The process generates a metallic layer on an initially exposed metal layer. The metallic layer is electrically conductive and corrosion resistant. The process includes providing a substrate having a metal layer with an exposed surface, depositing a second metal layer on the exposed surface, annealing the substrate to alloy a portion of the metal layer that includes the exposed surface and a portion of the second metal layer, and removing the unalloyed portion of the second metal layer. An alternative process includes providing a metal layer on the substrate, and electroless plating a corrosion-resistant metal or alloy on the metal layer. The alternative process may additionally include electroless plating a second corrosion-resistant metal on the corrosion-resistant metal or alloy.

10 Claims, 14 Drawing Sheets

SELF-ALIGNED CORROSION STOP FOR COPPER C4 AND WIREBOND

This application is a divisional of Ser. No. 09/311,973, filed on May 14, 1999 now U.S. Pat. No. 6,457,234.

BACKGROUND OF THE INVENTION

1. Technical Field

The present invention relates to chip attachment technology, and more particularly, to a process for fabricating corrosion-resistant conductive pads on a substrate, and to the associated structure.

2. Related Art

An electronic chip may be affixed to a substrate by use of an interconnect that electrically couples the chip to a conductive pad on the substrate. The conductive pad typically comprises copper. In wire bonding, for example, a wirebond interconnect from the chip is attached to the pad and serves to electrically connect the chip to the pad. As another example, a controlled collapse chip connection (C4) interconnect (e.g., a C4 solder ball on the chip) is attached to a conductive pad on a substrate that includes a chip carrier. Unfortunately, pads such as copper pads are susceptible to being oxidized or otherwise corroded due to contact between the pad and atmospheric constituents such as oxygen and moisture. Such corrosion jeopardizes the electrical contact between the wirebond and the pad, resulting in failure of the chip to properly perform in an operating environment.

A known process for reducing or eliminating the preceding problem includes forming a protective capping layer of aluminum on the pad. If the pad includes copper, an intervening thin-film layer between the aluminum cap and the copper pad will be needed to prevent a diffusion of the copper material of the pad into the aluminum capping layer. The thin-film layer may including such materials as titanium nitride or tantalum nitride. This process involves depositing a layer of aluminum on the substrate (or on the thin-film layer that is on the substrate), followed by lithographic patterning and etching, or alternatively chemical mechanical polishing (CMP) of the aluminum, to form the capping layer of aluminum on the pad. Unfortunately, these processes are expensive.

Another known process for dealing with the problem is passivating the copper pad with a known corrosion inhibitor such as benzotriazole. This involves immersing the substrate in the liquid corrosion inhibitor to form a protective film on the copper pad. Unfortunately, the film lacks durability because the layer is very thin and thermally decomposes when the substrate is heated to moderate temperatures.

Accordingly, there is a need for a corrosion resistant pad that is durably corrosion resistant and relatively inexpensive to fabricate.

SUMMARY OF THE INVENTION

The present invention overcomes the difficulties of the prior art by using a process for forming corrosion-resistant conductive pads on a substrate, comprising the steps of:
  providing a substrate having a metal layer with an initially exposed surface; and
  forming an electrically conductive and corrosion resistant metallic layer on the initially exposed surface. A metallic layer is a layer comprising an alloy, an unalloyed metal, or a combination of an alloy and an unalloyed metal.

The present invention has the advantage of providing a corrosion-resistant conductive pad on a substrate, wherein the pad maintains its integrity at elevated temperatures. The process of the present invention has the added advantage of being relatively inexpensive in contrast with the more costly current process that forms a protective capping layer of aluminum on a copper pad.

DETAILED DESCRIPTION OF THE INVENTION

Figure 6:
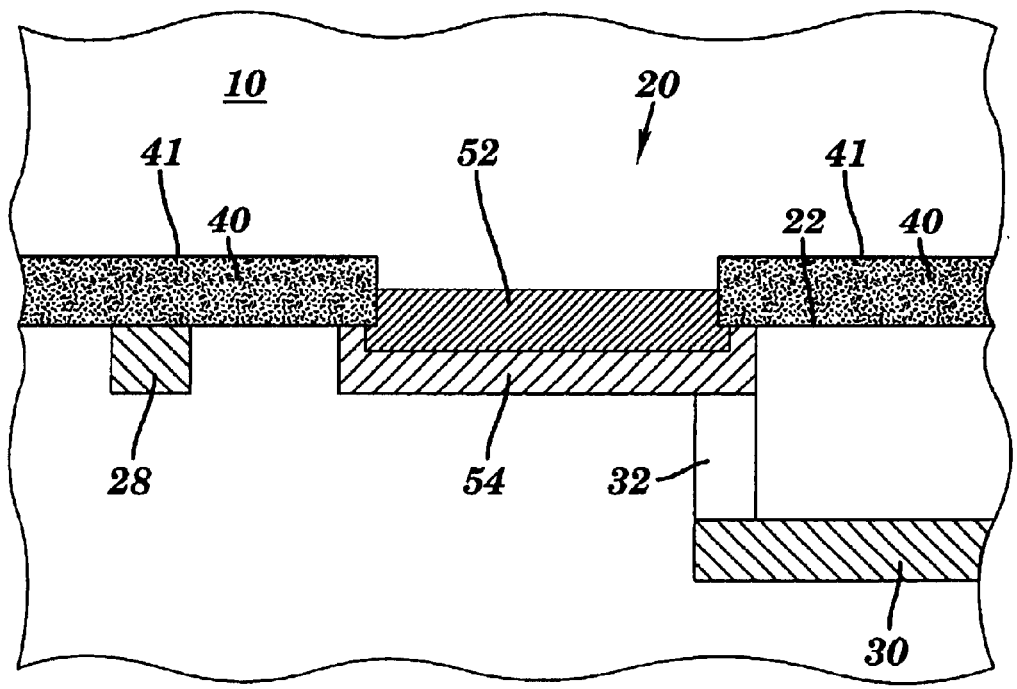
FIG. 6 depicts FIG. 5 after an unalloyed top portion of the second metal layer is removed.

FIG. 6 illustrates the result of a process that constitutes a first preferred embodiment of the present invention. As shown in FIG. 6, this process forms an electrically-conductive, corrosion-resistant metallic layer 52 on top of a metal layer 54, wherein the combination of the metallic layer 52 and the metal layer 54 is affixed to a substrate 20. The substrate 20 may be, inter alia, a semiconductor substrate. A metallic layer is a layer comprising an alloy, an unalloyed metal, or a combination of an alloy and an unalloyed metal. An electrically conductive material, such as an alloy or a metal, is corrosion resistant if it dose not oxidize or otherwise corrode due to atmospheric exposure under normal operating conditions (temperature, voltage, current, etc.) over its lifetime. Such corrosion may cause the electrical conductivity of the material, and/or the integrity of the connective metallurgical structure (wirebond interconnect, C4 interconnect such as a C4 solder ball, etc.), to degrade.

Figure 1:
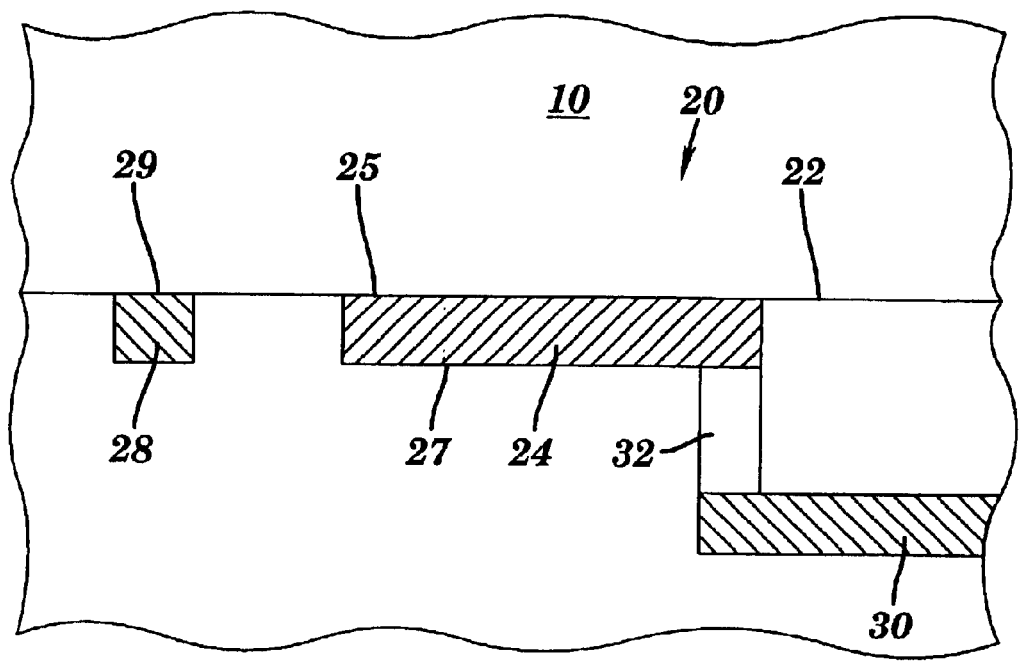
FIG. 1 depicts a side cross-sectional view of an exposed metal layer within a substrate, in accordance with a first preferred embodiment of the present invention.

FIG. 1 illustrates a first step of the preceding process whose result is shown in FIG. 6. In particular, FIG. 1 depicts a side cross-sectional view of a metal layer 24, comprising any suitable electrically conductive metal, such as copper (Cu), aluminum (Al), or tungsten (W), within a substrate 20. The metal layer 24 has a top surface 25 that is open to an atmosphere 10 located above the substrate 20. Although FIG. 1 shows the top surface 25 of the metal layer 24 as approximately coplanar with a top surface 22 of the substrate 20, the top surface 25 of the metal layer 24 may be above the top surface 22 of the substrate 20. The bottom surface 27 of the metal layer 24 is below the top surface 22 of the substrate 20. The substrate 20 comprises two optional layers: a wiring layer 28 and an internal wiring layer 30. The wiring layer 28 includes a wiring pattern such that a top surface 29 of the wiring layer 28 is approximately coplanar with the top surface 22 of the substrate 20. The top surface 29 of the wiring layer 28 is exposed to the atmosphere 10. The internal wiring layer 30 includes a wiring pattern and is located internally within the substrate 20 such that the metal layer 24 is electrically coupled to the internal wiring layer 30 by a via 32. This electrical coupling could be accomplished, for example, by having the via 32 plugged with a metal plug which is in physical and electrical contact with both the metal layer 24 and the wiring pattern of the internal wiring layer 30.

Figure 2:
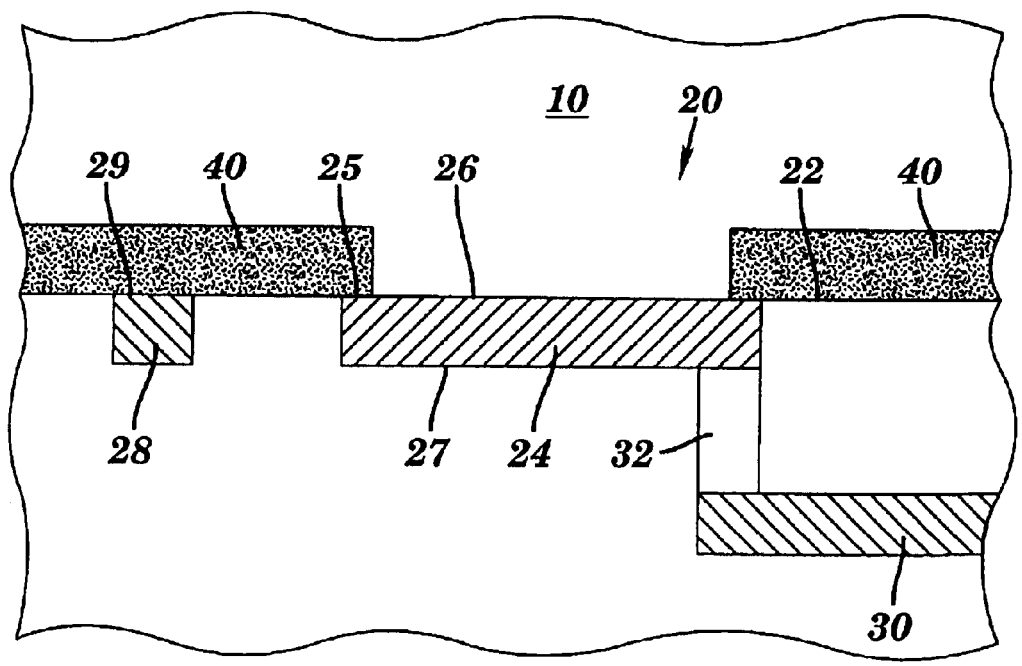
FIG. 2 depicts FIG. 1 after a dielectric layer is formed on the top surface of the substrate.
Figure 3:
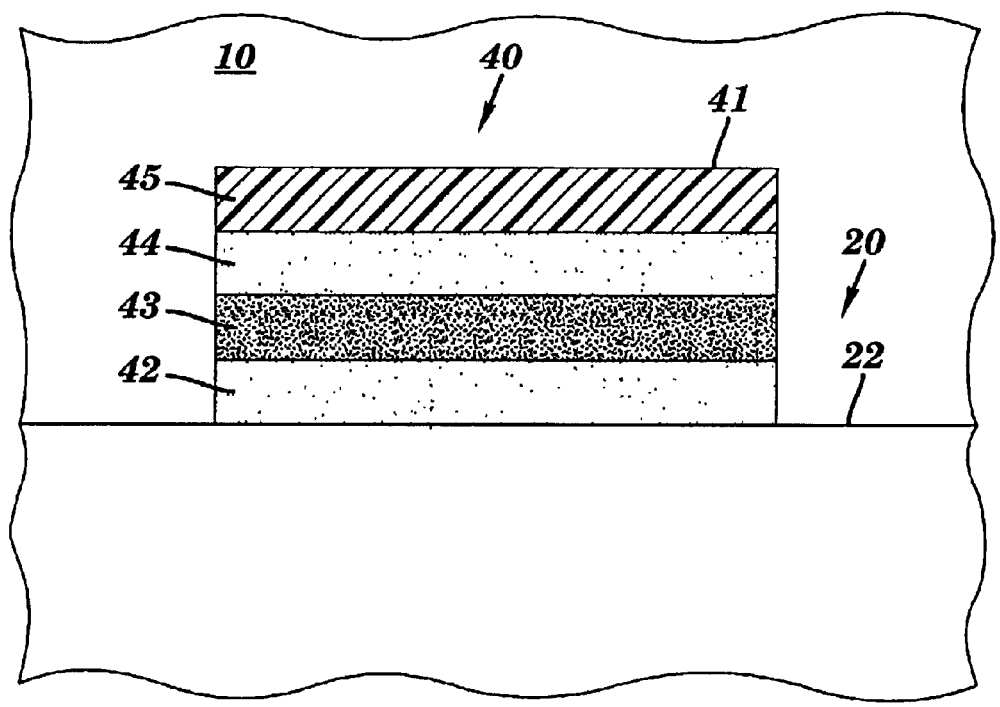
FIG. 3 depicts a portion of FIG. 2 which illustrates a four-layer representation of the dielectric layer in FIG. 2.

FIG. 2 depicts FIG. 1 after a dielectric layer 40 is formed on the top surface 22 of the substrate 20, wherein an opening in the dielectric layer 40 reveals an initially exposed surface 26 of the metal layer 24. The dielectric layer 40 provides a mechanism for selectively exposing only a portion (i.e., surface 26) of the top surface 25 of the metal layer 24, and not the entire top surface 25 of the metal layer 24, to the atmosphere 10. Other mechanisms for selectively exposing a portion of the top surface 25 of the metal layer 24 to the atmosphere 10 are possible. The dielectric layer 40 is an optional passivation layer and may have a composition comprising dielectric material. For example, the dielectric layer 40 may comprise four layers, as illustrated FIG. 3, wherein a first nitride layer 42 is on the top surface 22 of the substrate 20, wherein an oxide layer 43 is on the first nitride layer 42, wherein a second nitride layer 44 is on the oxide layer 43, and wherein a polyimide layer 45 is on the second nitride layer 44. The first nitride layer 42 may comprise such nitrides as $Si_3N_4$ and may be formed by such methods as chemical vapor deposition (CVD). $Si_3N_4$ has the advantageous property of adhering firmly to copper and also acting as a copper diffusion barrier. The oxide layer 43 may comprise such oxides as CVD-formed $SiO_2$ and provides electrical insulation. The second nitride layer 44 may comprise such nitrides as CVD-formed $Si_3N_4$, and act as a moisture barrier. The second nitride layer 44 and the oxide layer 43 together act as a passivation layer to prevent diffusion of impurities, water, and/or humidity, into the substrate, and also to protect against mechanical damage. The polyimide layer 45 comprises a polyimide polymer, or similar material such as benzocyclobutene (BCB), which provides mechanical protection against damage due to its elastic properties and its protective thickness, typically in the range of 0.30 microns to 30 microns. The configuration of FIG. 3 is only an example, and any combination of the layers in FIG. 3 may be combined to form the dielectric layer 40. For example, the polyimide layer 45 could be eliminated totally or eliminated from the process step of FIG. 2 and instead formed on the second nitride layer 44 after the metallic layer of the present invention is formed (e.g., after the process step associated with FIG. 6 or FIG. 8, infra). Alternatively, other configurations unrelated to FIG. 3 may be used for the dielectric layer 40. Additionally, the process step of forming the dielectric layer 40 is optional and may be eliminated altogether. If the optional dielectric layer 40 is absent, then the initially exposed portion 26 of the metal layer 24 is the entire top surface 25 of the metal layer 24.

The next step is forming the electrically conductive, corrosion-resistant pad of the present invention which comprises a top portion exposed to the atmosphere 10, and a bottom portion. The top portion is an electrically conductive, corrosion-resistant metallic layer. The bottom portion is a portion of the metal layer 24 of FIG. 2. The metallic layer protects the electrically conductive bottom portion from corrosive attack by the atmosphere 10. Any suitable method may be used to form the metallic layer and the bottom portion. Two particular methods of the present invention, an annealing method and an electroless plating method, are described infra.

Figure 4:
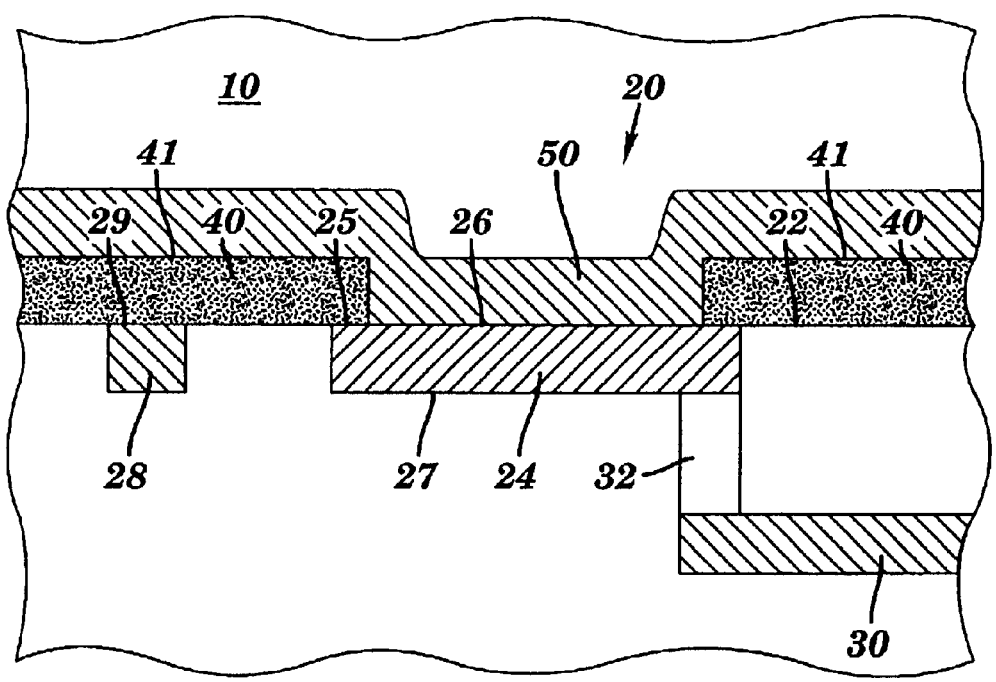
FIG. 4 depicts FIG. 2 after a second metal layer is deposited on the substrate.

The annealing method of the present invention starts with depositing a second metal layer 50 on the substrate 20, as shown in FIG. 4. The second metal layer 50 also covers the optional dielectric layer 40 if the optional dielectric layer 40 is present. The second metal layer 50 comprises an alloyable metal, such as tin (Sn), indium (In), aluminum (Al), or zinc (Zn). The second metal layer 50 may be deposited on the substrate 20 by any feasible method, such as chemical vapor deposition (CVD) or physical vapor deposition (PVD).

Next, the substrate is annealed at a temperature in the range of about 150° C. to about 400° C. for a time period in the range of about 5 minutes to about 120 minutes. The annealing causes the second metal layer 50 to interact with the metal layer 24 at the annealing temperature, to form the metallic layer 52 shown in FIG. 5. In particular, the metallic layer 52 in FIG. 5 comprises an alloy of metal derived from a top portion of the metal layer 24 (see FIG. 4 for metal layer 24) and second metal derived from a bottom portion of the second metal layer 50 (see FIG. 4 for second metal layer 50), leaving a top portion 56 in FIG. 5 of the second metal layer 50 unalloyed, and also leaving a bottom portion 54 in FIG. 5 of the metal layer 24 unalloyed. The bottom portion 54 of the metal layer 24, though unalloyed, includes impurities of metal from the metal layer 24, because the annealing causes the metal from the second metal layer 50 to be distributed within the metal layer 24. The details of this distribution varies with the conditions of annealing (i.e., temperature and time of annealing) and the particular metals to be annealed.

Figure 20:
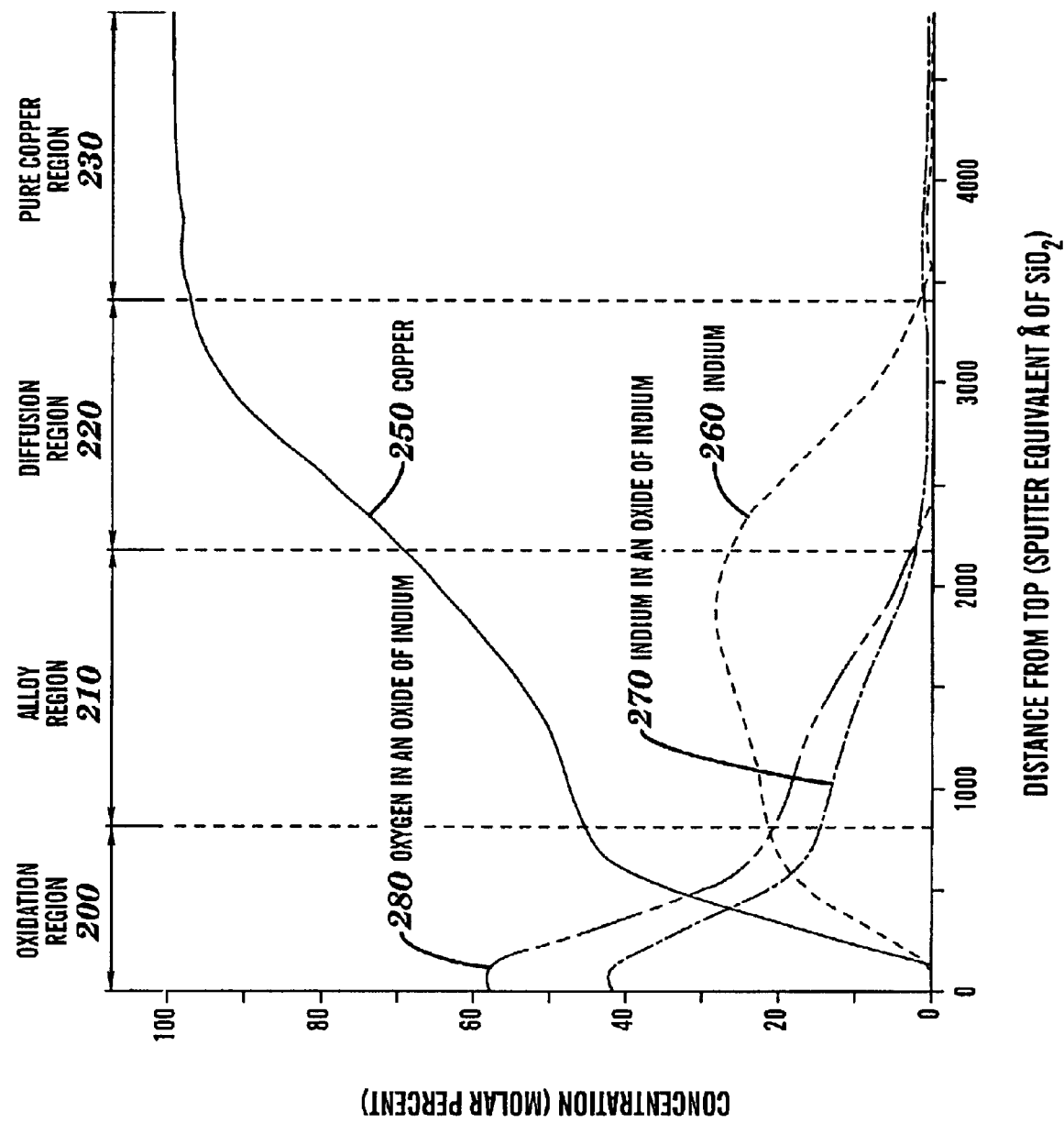
FIG. 20 depicts the distribution of tin and indium resulting from annealing adjacent indium and copper layers.

FIGS. 20–23 illustrate experimental data in support of the annealing method. FIG. 20 relates to the annealing of a configuration having a 178 nm layer of indium on top of a 1.48 μm layer of copper. The annealing was performed at 400° C. for 30 minutes in an oxygen ambient environment. The oxygen environment conservatively promoted maximal corrosion by oxidation. Following annealing, the distributions in FIG. 20 were determined by using a sputtering process to remove the annealed layer continuously and measuring the concentrations of materials at removed levels. Said measuring was accomplished via the Auger technique of electron bombardment followed by measurement of energy levels and energy flux of the consequent secondary electrons. The distance, as denoted on the abscissa of FIG. 20 and determined by Auger analysis, is from the top of the annealed configuration and is expressed in terms of the sputter equivalent of $SiO_2$. The spatial position within the annealed material, as denoted in FIG. 20, is approximately proportional to the sputtering time. Noting that the sputtering rate is a function of the particular material removed, and that the distance coordinate in FIG. 20 is expressed as equivalent angstroms of $SiO_2$, the distances should be viewed as relative distances, wherein absolute distances can be estimated by multiplying the FIG. 20 distances by the ratio of the sputtering rate of the material removed to the sputtering rate for removing $SiO_2$, or alternatively by comparing individual measurements of sputtering rate with previously collected calibration data on sputtering rates.

The annealing process in the oxygen ambient environment is characterized by diffusion of indium through copper grains and grain boundaries, and alloying of indium with copper atoms where the concentration of indium is high enough to permit such alloy formation. The preceding processes result in four physically distinct regions: oxidation region 200, alloy region 210, diffusion region 220, and pure copper region 230, respectively characterized by oxidation of indium [and indium-copper alloy], alloying of copper and indium without oxidation, diffusion of indium into the bulk copper, and pure copper. The alloy region 210 results from a bulk reaction of copper and indium. The diffusion region 220 is characterized by grain boundary diffusion such that indium particles diffuse into the copper material as impurities and do not react with the copper, since the indium concentration is too low to permit alloy formation. Thus, there is no alloy formation in the diffusion region 220.

The curves shown in FIG. 20 are: an indium curve 270 of the indium content of an oxide of indium, an oxygen curve 280 of the oxygen content of the oxide of indium, an indium curve 260 representing an aggregate of indium in alloyed form and in pure metallic form, and a copper curve 250 representing an aggregate of copper in alloyed form and in pure metallic form. In the oxidation region 200, an oxide of indium is formed, as denoted by the parallel curves of indium 270, and of oxygen 280, in the oxide of indium. The oxide of indium thus formed is a consequence of the oxygen environment in which the annealing was executed. However, an oxide of copper is not present in the oxidation region 200, which demonstrates the protection of copper from corrosion by the annealing of indium under the stated conditions.

Figure 21:
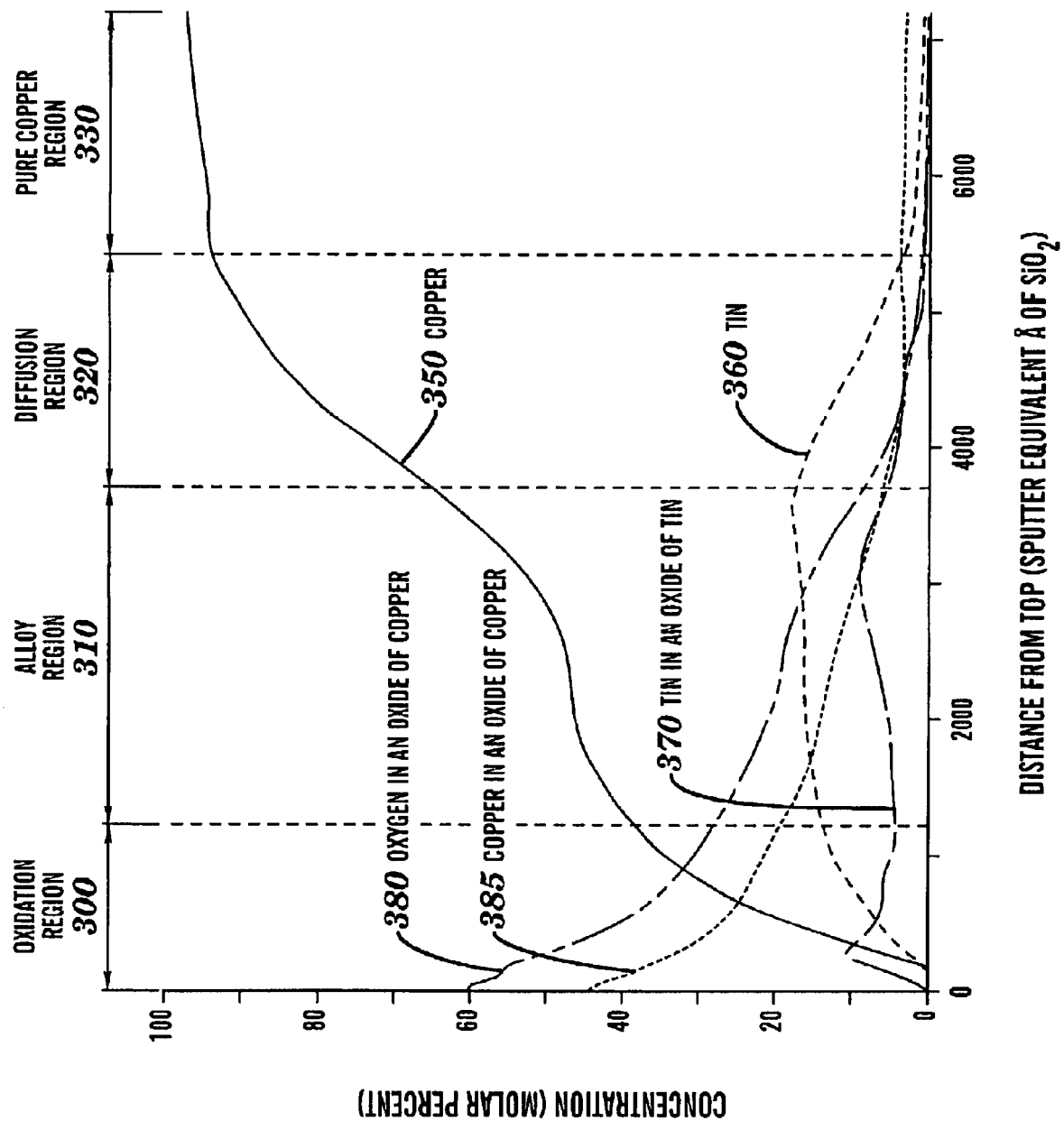
FIG. 21 depicts the distribution of tin and copper resulting from annealing adjacent tin and copper layers.

FIG. 21 relates to the annealing of a configuration having a 145 nm layer of tin on top of a 1.48 µm layer of copper. The annealing was performed at 350° C. for 30 minutes in an oxygen environment. The oxygen environment conservatively promoted maximal corrosion by oxidation. Following annealing, the distributions in FIG. 21 were determined by using a sputtering process with the Auger technique described supra for FIG. 20. The distance, as denoted on the abscissa of FIG. 21 and determined by the Auger analysis, is from the top of the annealed configuration and is expressed in terms of the sputter equivalent of $SiO_2$. FIG. 21 shows the distribution of materials resulting from the annealing in terms of four regions: oxidation region 300, alloy region 310, diffusion region 320, and pure copper region 330, respectively characterized by oxidation of copper and tin, alloying of copper and tin, diffusion of tin into the bulk copper, and pure copper. The alloy region 310 results from a bulk reaction of copper and tin. The diffusion region 320 is characterized by grain boundary diffusion, wherein tin particles diffuse into the copper material as impurities and do not react with the copper.

The curves shown in FIG. 21 are: a copper curve 385 of the copper content of an oxide of copper, a tin curve 370 of the tin content of oxide of tin, an oxygen curve 380 of the oxygen content the oxide of copper, a tin curve 360 representing an aggregate of tin in annealed form and in pure metallic form, and a copper curve 350 representing an aggregate of copper in annealed form and in pure metallic form. In the oxidation region 300, an oxide of copper is formed, as denoted by the parallel curves of copper 385, and of oxygen 380, in copper oxide. Thus, annealing with tin at 350° C. is not fully effective in protecting copper against corrosion in an oxygen environment. Nonetheless, FIG. 23 (to be discussed infra) will demonstrate corrosion protection for copper by tin when annealing occurs at 350° C., with greater protection afforded by annealing in air rather than by annealing in oxygen. Furthermore, it is known that the annealing of tin with copper at 300° C. in air effectively protects copper against corrosion.

Figure 22:
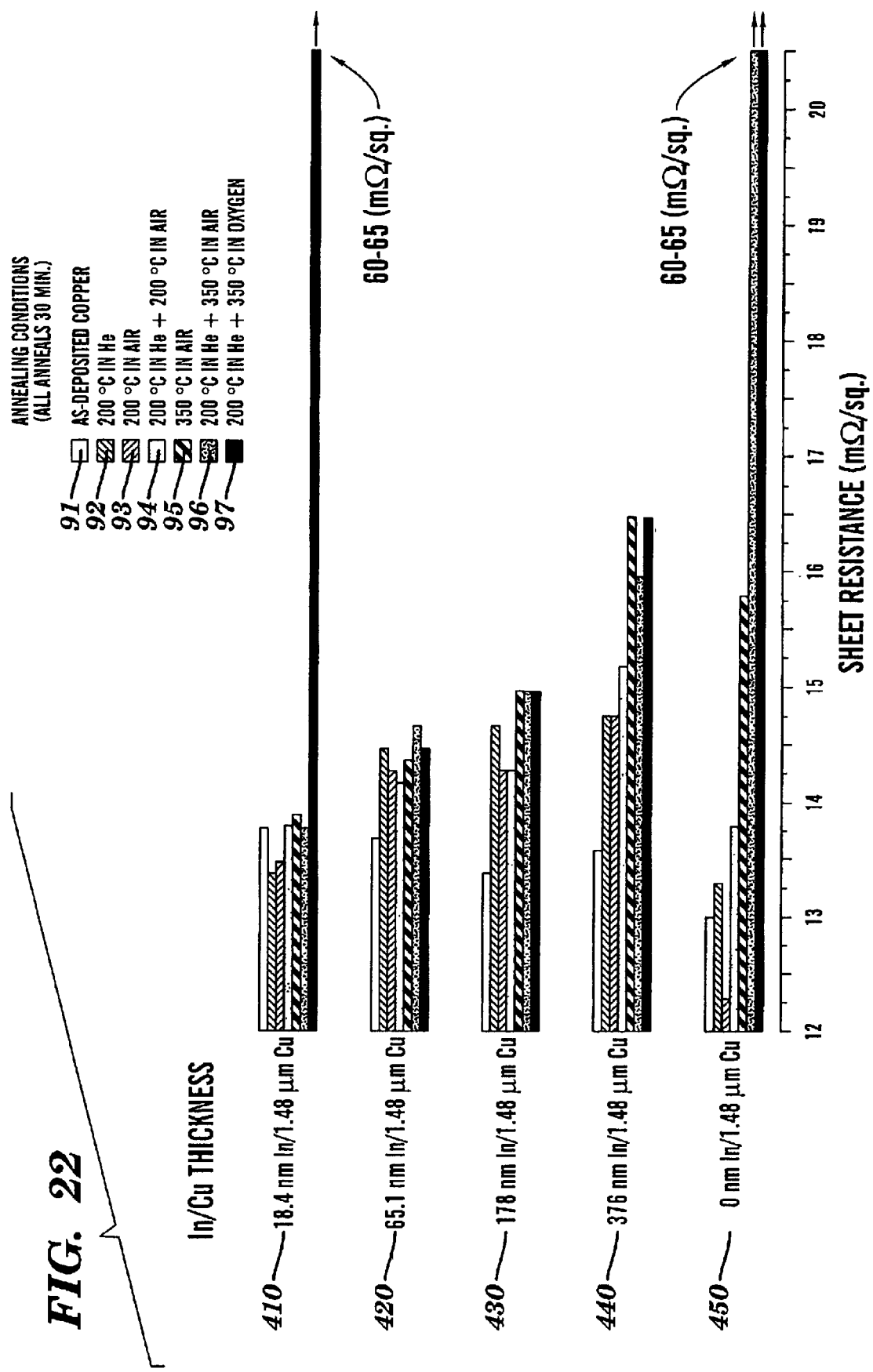
FIG. 22 depicts sheet resistance resulting from annealing adjacent indium and copper layers.

FIG. 22 shows the sheet resistance of an annealed structure resulting from the annealing of a layer of indium on top of a 1.48 µm layer of copper. Sheet resistances are shown in FIG. 22 for indium layers having thicknesses of 18.4 nm, 65.1 nm, 178 nm, 376 nm, and 0 nm, denoted respectively as cluster 410, 420, 430, 440, 450. Each of the preceding clusters contains data for each of the following annealing conditions:

91 (as-deposited copper, with no annealing), 92 (annealing at 200° C. in helium for 30 min.), 93 (annealing at 200° C. in air for 30 min.), 94 (annealing at 200° C. in helium for 30 min. and 200° C. in air for 30 min.), 95 (annealing at 350° C. in air for 30 min.), 96 (annealing at 200° C. in helium for 30 min. and 350° C. in air for 30 min.), and 97 (annealing at 200° C. in helium for 30 min. and 350° C. in oxygen for 30 min.), FIG. 22 shows that, with a sufficient thickness of initially deposited indium (clusters 420, 430 and 440), the annealed configuration has a sheet resistance of 13–17 mΩ/sq., which is of the same order as the sheet resistance for the as-deposited metal (copper) 91, namely 13–14 mΩ/sq. The high sheet resistance (60–65 mΩ/sq.) for the 350° C. annealing condition 97 of cluster 410 is attributed to an insufficiency of indium thickness (18.4 nm); i.e., discontinuous surface coverage by indium. Cluster 450 represents a base case of no deposited indium, for comparison purposes, and demonstrates that unprotected copper acquires a high sheet resistance (60–65 mΩ/sq.) under annealing conditions 96 and 97, which occur at 350° C. Inasmuch as the high sheet resistance is attributed to corrosive oxidation, FIG. 22 shows that annealing a copper layer with an indium layer of at least 65.1 nm protects the copper against unacceptable oxidation under any of the annealing conditions 92–97.

Figure 23:
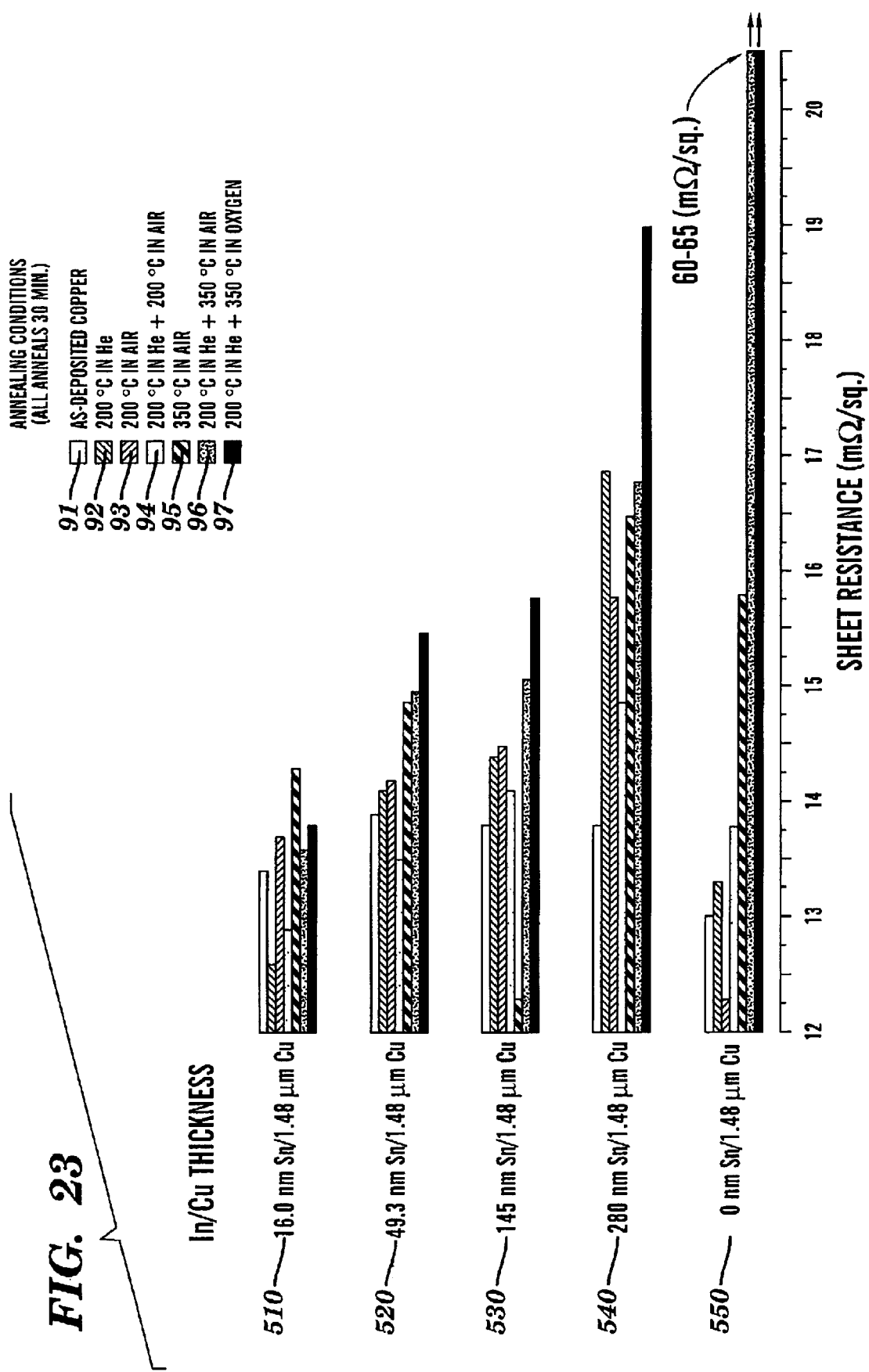
FIG. 23 depicts sheet resistance resulting from annealing adjacent tin and copper layers.

FIG. 23 shows the sheet resistance of an annealed structure resulting from the annealing of a layer of tin on top of a 1.48 µm layer of copper. Sheet resistances are shown in FIG. 23 for tin layers having thicknesses of 16.0 nm, 49.3 nm, 145 nm, 280 nm, and 0 nm, denoted respectively as cluster 510, 520, 530, 540, 550. Each of the preceding clusters contains data for each of the annealing conditions 91–97 described supra for FIG. 22. FIG. 23 shows that the annealed configuration of clusters 510, 520, 530, 540, and 550 has a sheet resistance of 13–19 mΩ/sq., which is of the same order as the sheet resistance for the as-deposited metal (copper) 91, namely 13–14 mΩ/sq. Cluster 550 represents a base case of no deposited tin, for comparison purposes, and demonstrates that unprotected copper acquires a high sheet resistance (60–65 mΩ/sq.) under annealing conditions 96 and 97, which occur at 350° C. Inasmuch as the high sheet resistance is attributed to corrosive oxidation, FIG. 23 shows that annealing a copper layer with an tin layer of at least 16.0 nm protects the copper against unacceptable oxidation under any of the annealing conditions 92–97.

Figure 5:
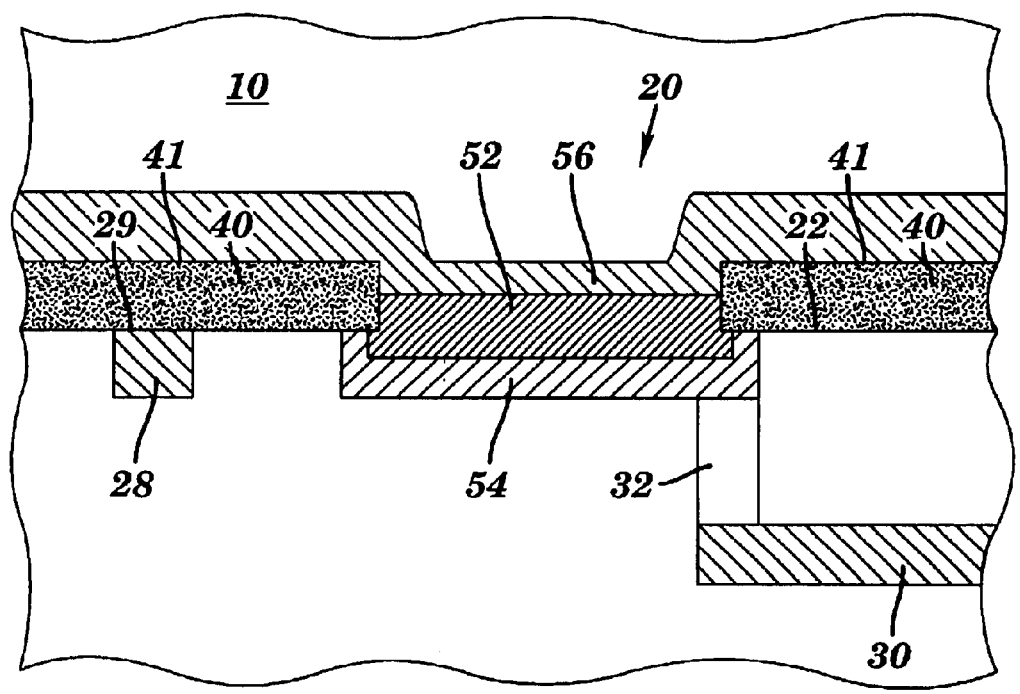
FIG. 5 depicts FIG. 4 after an annealing step forms a metallic layer.

Following annealing, the unalloyed top portion 56 in FIG. 5 of the second metal layer 50 (see FIG. 4) is removed so as to leave the metallic layer 52 in FIG. 5 exposed to the atmosphere 10, as well as to leave the optional dielectric layer 40 exposed to the atmosphere 10, as shown in FIG. 6. This removal of unalloyed second metal may be accomplished by any feasible process, such as using a wet etch solution. The type of wet etch solution to use depends on the type of second metal to be removed. The following table indicates a wet etch solution that could be used for selectively removing unreacted Sn, In, Zn, or Al without removing the copper-based alloy of the Sn, In, Zn, or Al, respectively. See Petzow, Gunter, "Metallographic Etching," American Society For Metals, Metals Park, Ohio, pages 43, 50, 85, 88 (1978).

| Unalloyed Second Metal (Relative To A Copper Alloy Of The Second Metal) | Example of Solution That Could Be Used To Etch Away The Unalloyed Second Metal (page number in Petzow reference) |
| --- | --- |
| Tin (Sn) | 25 ml glycerol + 2 ml 40% HF + 1 drop nitric acid (page 85) |
| Indium (In) | 40 ml H$_2$O + 10 ml 40% HF + 10 ml H$_2$O$_2$ (page 50) |
| Zinc (Zn) | 50 ml H$_2$O + 50 ml (HCl or nitric acid) (won't etch CuZn) (page 88) |
| Aluminum (Al) | 200 ml H$_2$O + 10 ml 35% fluoboric acid (electrolytic) (page 43) |

The wet etch solutions in the preceding table are illustrative inasmuch as other wet etch solutions could be used for the above-indicated second metals as well as for other types of second metals that could potentially be utilized for forming the metallic layer.

The metallic layer 52 created by the annealing process covers and protects the unalloyed bottom portion 54 of the metal layer 24 (see FIG. 4) from corrosive attack by the atmosphere 10 and provides a conductive, corrosion-resistant interface for subsequent wirebonding or C4 interconnect. Thus, the annealing process generates the electrically conductive, corrosion resistant pad of the present invention.

Figure 7A:
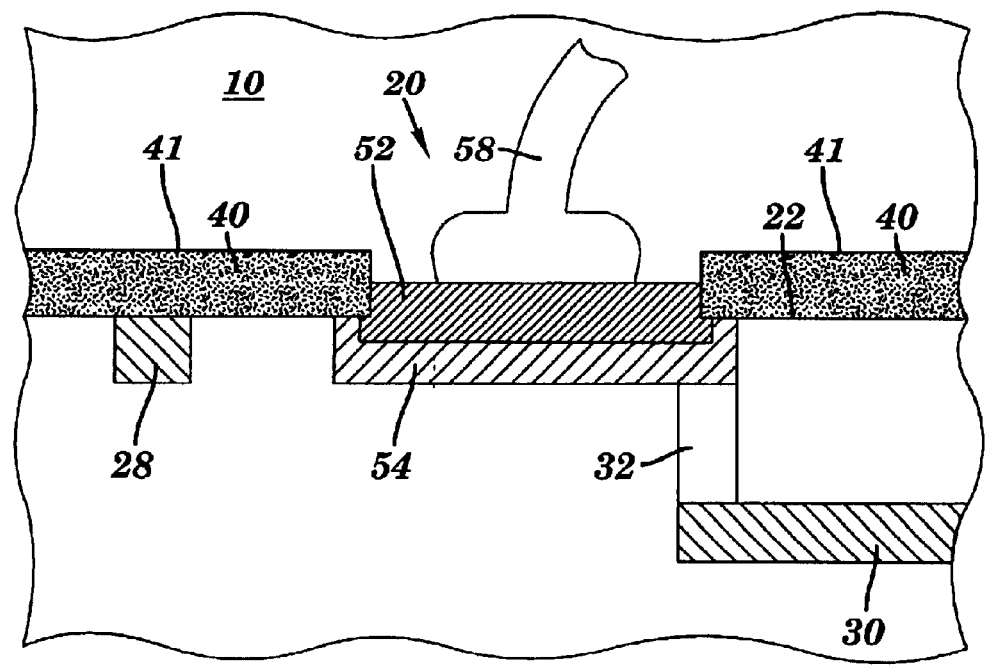
FIG. 7A depicts FIG. 6 after a wirebond is attached to the metallic layer.
Figure 7B:
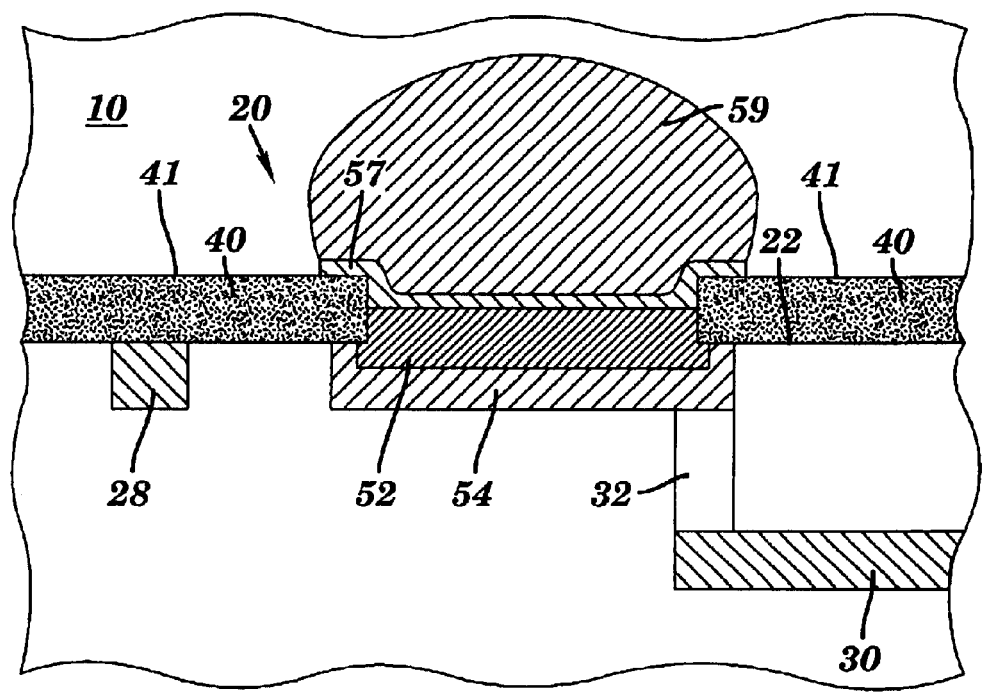
FIG. 7B depicts FIG. 7A with the wirebond being replaced by a C4 solder ball.

Standard processing may follow removal of the unalloyed top portion 56 of the second metal layer, included dicing and packaging of the substrate, as well as attaching wirebond or C4 interconnect to the metallic layer of the corrosion-resistant conductive pad. FIG. 7A illustrates a wirebond 58 attached to the metallic layer 52. The wirebond 58 may include, inter alia, gold or an aluminum-silicon alloy. A C4 interconnect, such as a C4 solder ball, may be substituted for the wirebond 58 in FIG. 7A. As an example, FIG. 7B shows a C4 solder ball 59, with an associated ball-limiting metallurgy layer 57, substituted for the wirebond 58 in FIG. 7A.

Figure 8:
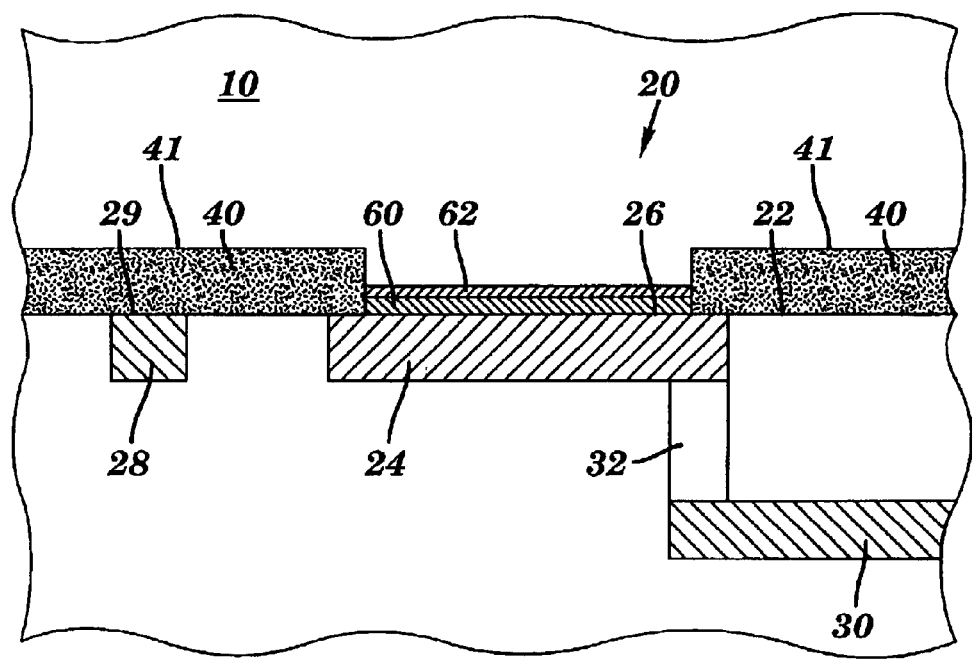
FIG. 8 depicts FIG. 2 after a metallic layer, covered by an optional thin film, is electroless plated on the metal layer.

The electroless plating method of the present invention starts with depositing a metallic layer on the initially exposed surface 26 of metal layer 24 of FIG. 2 by electroless plating, which is indicated as metallic layer 60 in FIG. 8. The electroless plating involves immersing the substrate 20 into an aqueous solution of electrolyte having metal ions, wherein the metal ions deposit onto the metal layer 24, but do not deposit onto the optional dielectric layer 40 or to non-metallic portions of the top surface 22 of the substrate 20. Any suitable electrically conductive, corrosion-resistant metal or alloy may be electroless plated to form the metallic layer 60. Suitable metals for forming the metallic layer 60 include nickel, palladium, and gold. Suitable alloys for forming the metallic layer 60 include nickel-phosphorus, cobalt-phosphorus, and cobalt-tungsten-phosphorus. The metallic layer 60 deposited on the metal layer 24 by the electroless plating covers and protects the metal layer 24 from corrosive attack by the atmosphere 10 and provides a conductive, corrosion-resistant interface for subsequent wirebonding or C4 interconnect. An optional electroless plating of a thin film 62 of a suitable metal, such as gold or palladium, on the metallic layer 60 could be implemented to provide additional corrosion resistance. The optional thin film 62 would also improve wirebonding capability by inhibiting formation of an oxide of the metal or alloy of the metallic layer 60, since any such formed oxide may degrade the quality of subsequent wirebonding. The metallic layer 60 may be optionally formed from a suitable metal (e.g., gold) that is the same metal of which the optional thin film is comprised. Thus, the electroless plating generates the electrically conductive, corrosion resistant pad of the present invention.

Figure 9:
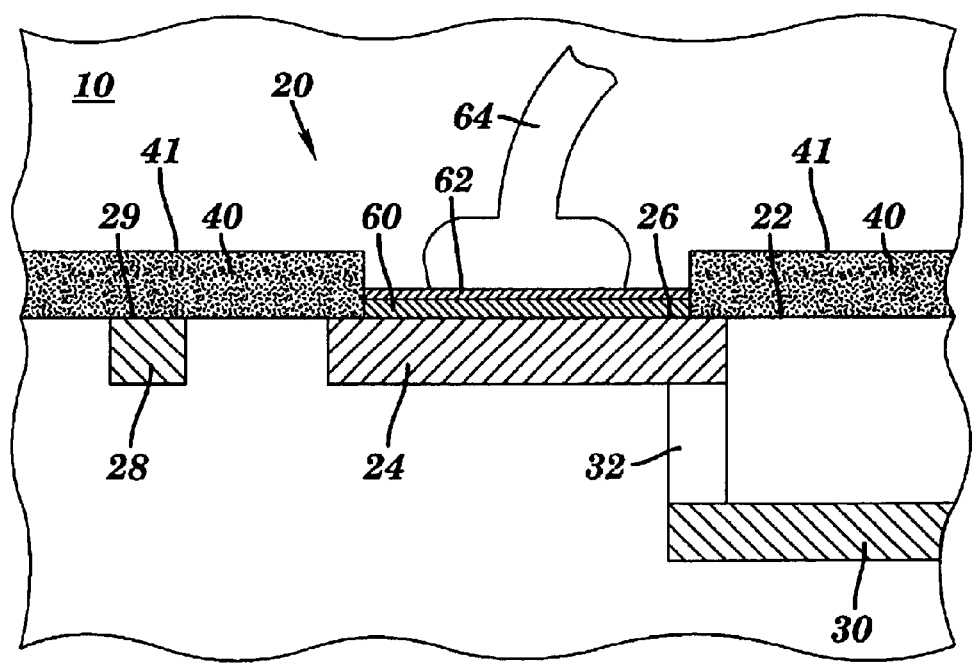
FIG. 9 depicts FIG. 8 after a wirebond is attached to the thin film.

Standard processing may follow the electroless plating, included dicing and packaging of the substrate as well as attaching wirebond or C4 interconnect to the metallic layer, or to the optional thin film, of the corrosion-resistant conductive pad. FIG. 9 illustrates a wirebond 64 attached to the optional thin film 62. If the optional thin film 62 were not present, the wirebond 64 would be attached to the metallic layer 60. A C4 interconnect may be substituted for the wirebond 64 in FIG. 9, such as the C4 solder ball 59 shown in FIG. 7B.

Figure 10:
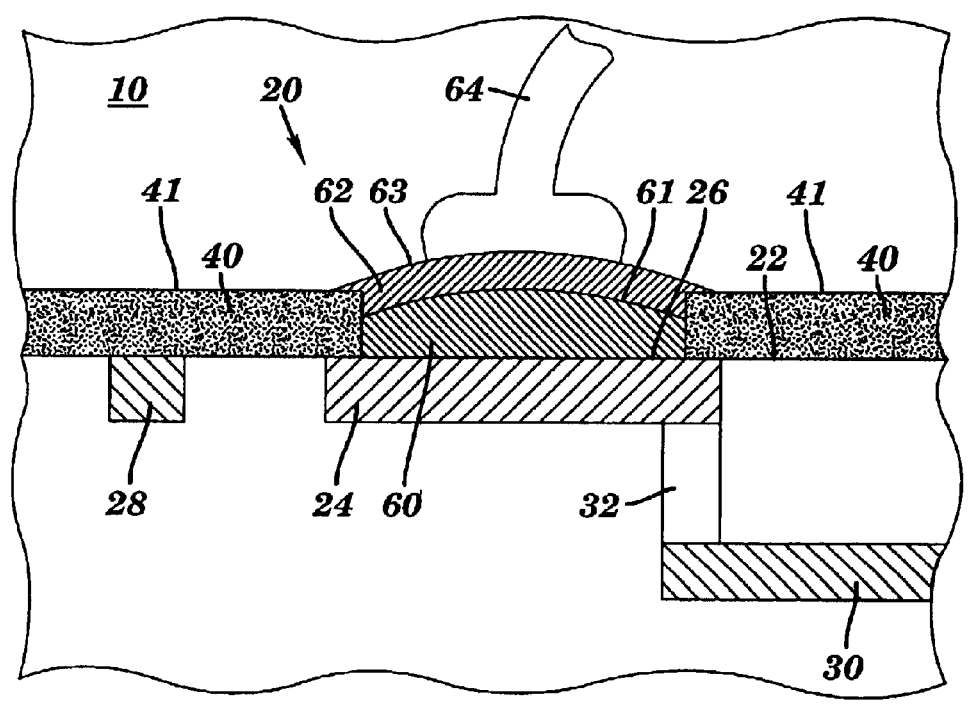
FIG. 10 illustrates FIG. 9 with the top surface of the thin film above the top surface of the dielectric layer.

Although FIGS. 8–9 show the metallic layer 60 and the optional thin film 62 as being totally below the top surface 41 of the dielectric layer 40, a portion of the metallic layer 60 and/or the optional thin film 62 could be above the top surface 41 of the dielectric layer 40. FIG. 10 illustrates FIG. 9 with the modification that the top surface 63 of the thin film 62 is above the top surface 41 of the dielectric layer 40. It is also possible for the top surface 61 of the metallic layer 60 in FIG. 10 to be above the top surface 41 of the dielectric layer 40, with or without the optional thin film 62.

Figure 11:
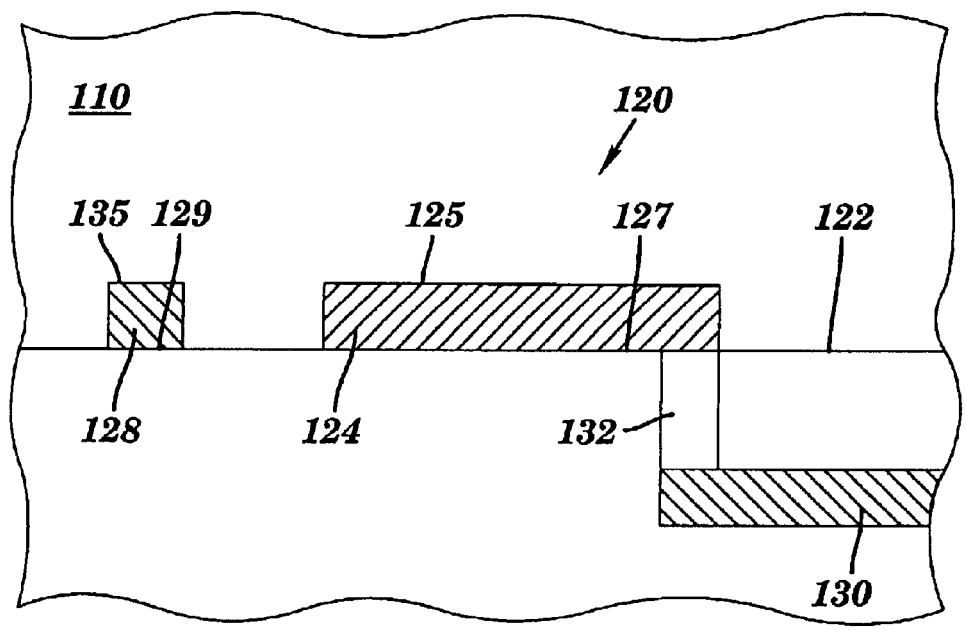
FIG. 11 depicts a side cross-sectional view of an exposed metal layer on a substrate, in accordance with a second preferred embodiment of the present invention.
Figure 15:
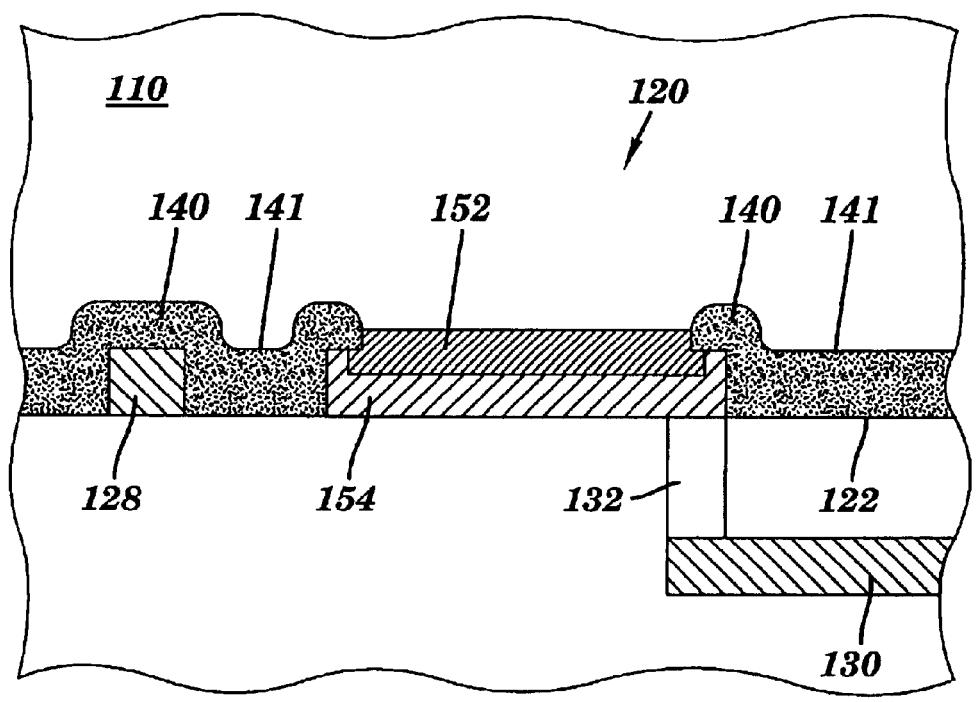
FIG. 15 depicts FIG. 14 after an unalloyed top portion of the second metal layer is removed.

FIG. 11 illustrates a first step of a process that constitutes a second preferred embodiment of the present invention. As shown in FIG. 15, the process forms an electrically-conductive, corrosion-resistant metallic layer on top of a metal pad, wherein the combination of the metallic layer and the metal layer is affixed to a substrate 120. The substrate 120 may be, inter alia, a semiconductor substrate. In particular, FIG. 11 depicts a side cross-sectional view of a metal layer 124, comprising any suitable electrically conductive metal such as copper (Cu), aluminum(Al), and tungsten (W), on a substrate 120. The metal layer 124 has a bottom surface 127 which is approximately coplanar with a top surface 122 of the substrate 120. The top surface 125 of the metal layer 124 is above the top surface 122 of the substrate 120 and is open to an atmosphere 110 located above the substrate 120. The metal layer 124 could be formed by any suitable process, such as by photolithography and etching. A prime distinction between the process associated with FIG. 1 and the process associated with FIG. 11 is that a portion of the metal layer 24 in FIG. 1 is within the substrate 20, while the entire metal layer 124 in FIG. 11 is on top of the substrate 120. The substrate 120 in FIG. 11 comprises two optional layers: a wiring layer 128 and an internal wiring layer 130. The wiring layer 128 includes a wiring pattern such that a bottom surface 129 of the wiring layer 128 is approximately coplanar with the top surface 122 of the substrate 120. The top surface 135 of the wiring layer 128 is exposed to the atmosphere 110. The internal wiring layer 130 includes a wiring pattern and is located internally within the substrate 120 such that the metal layer 124 is electrically coupled to the internal wiring layer 130 by a via 132. This electrical coupling could be accomplished, for example, by plugging the via 132 with a metal plug which is in physical and electrical contact with both the metal layer 124 and the wiring pattern of the internal wiring layer 130.

Figure 12:
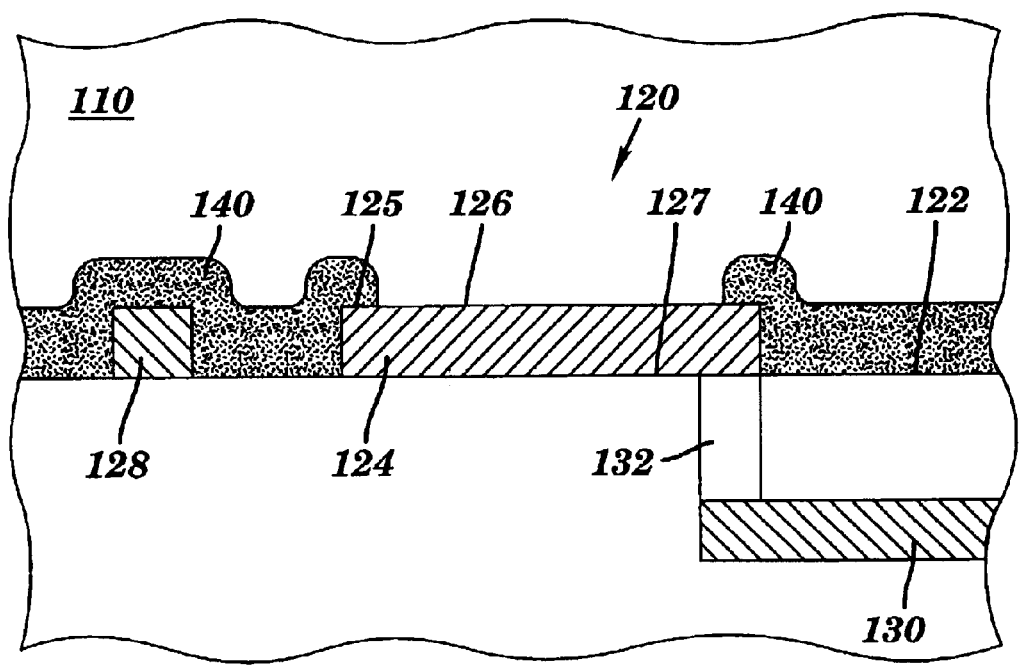
FIG. 12 depicts FIG. 11 after a dielectric layer is formed on the top surface of the substrate.

FIG. 12 depicts FIG. 11 after a dielectric layer 140 is formed on the top surface 122 of the substrate 120, wherein an opening in the dielectric layer 140 reveals an initially exposed portion 126 of the metal layer 124 to the atmosphere 110. The dielectric layer 140 is an optional passivation layer and may have a composition comprising dielectric material. The dielectric layer 140 of FIG. 12 is of the same nature as the dielectric layer 40 of FIG. 2, described supra. If the optional dielectric layer 140 is absent, then the initially exposed portion 126 of the metal layer 124 is the entire top surface 125 of the metal layer 124.

The next step is forming the electrically conductive, corrosion-resistant pad of the present invention which comprises a top portion exposed to the atmosphere 110, and a bottom portion. The top portion is an electrically conductive, corrosion-resistant metallic layer. The bottom portion is a portion of the metal layer 124 of FIG. 12. The metallic layer protects the electrically conductive bottom portion from corrosive attack by the atmosphere 110. Any suitable method may be used to form the metallic layer and the bottom portion. Two particular methods of the present invention, an annealing method and an electroless plating method, are described infra.

Figure 13:
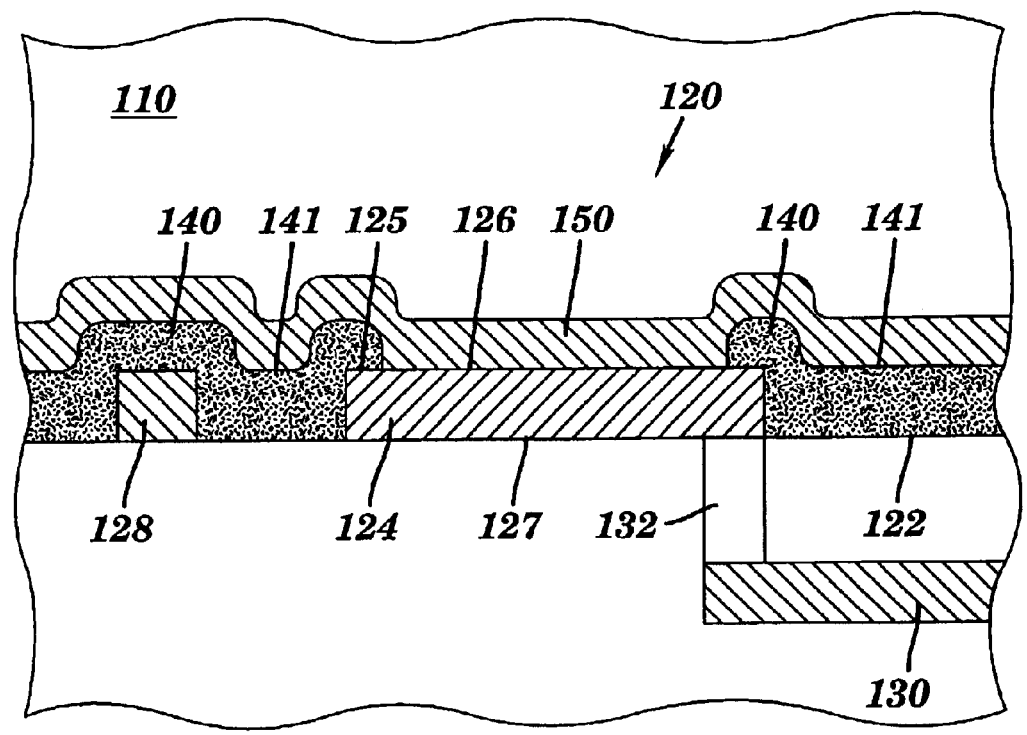
FIG. 13 depicts FIG. 12 after a second metal layer is deposited on the substrate.

The annealing method of the present invention starts with depositing a second metal layer 150 on the substrate 120, as shown in FIG. 13. The second metal layer 150 also covers the optional dielectric layer 140 if the optional dielectric layer 140 is present. The second metal layer 150 comprises an alloyable metal, such as tin (Sn), indium (In), aluminum (Al), or zinc (Zn). The second metal layer 150 may be deposited on the substrate 120 by any feasible method, such as chemical vapor deposition (CVD) or physical vapor deposition (PVD).

Next, the substrate is annealed at a temperature in the range of about 150° C. to about 400° C. for a time period in the range of about 5 minutes to about 120 minutes. The annealing causes the second metal layer 150 to interact with the metal layer 124 at the annealing temperature, to form the metallic layer 152 shown in FIG. 14. In particular, the metallic layer 152 in FIG. 14 comprises an alloy of metal from a top portion of the metal layer 124 (see FIG. 13 for metal layer 124) and second metal from a bottom portion of the second metal layer 150 (see FIG. 13 second metal layer 150), leaving a top portion 156 in FIG. 14 of the second metal layer 150 unalloyed, and also leaving a bottom portion 154 in FIG. 14 of the metal layer 24 unalloyed. The bottom portion 154 of the metal layer 124, though unalloyed, includes impurities of metal from the metal layer 124, because the annealing causes the metal from the second metal layer 150 to be distributed continuously throughout the metal layer 124. The details of this distribution varies with the conditions of annealing and the metals to be annealed. The prior discussion of FIGS. 19–22, regarding experimental data for the annealing of adjacent indium and copper layers, and for the annealing of adjacent tin and copper layers, applies to formation of the metallic layer 152 in FIG. 14.

Figure 14:
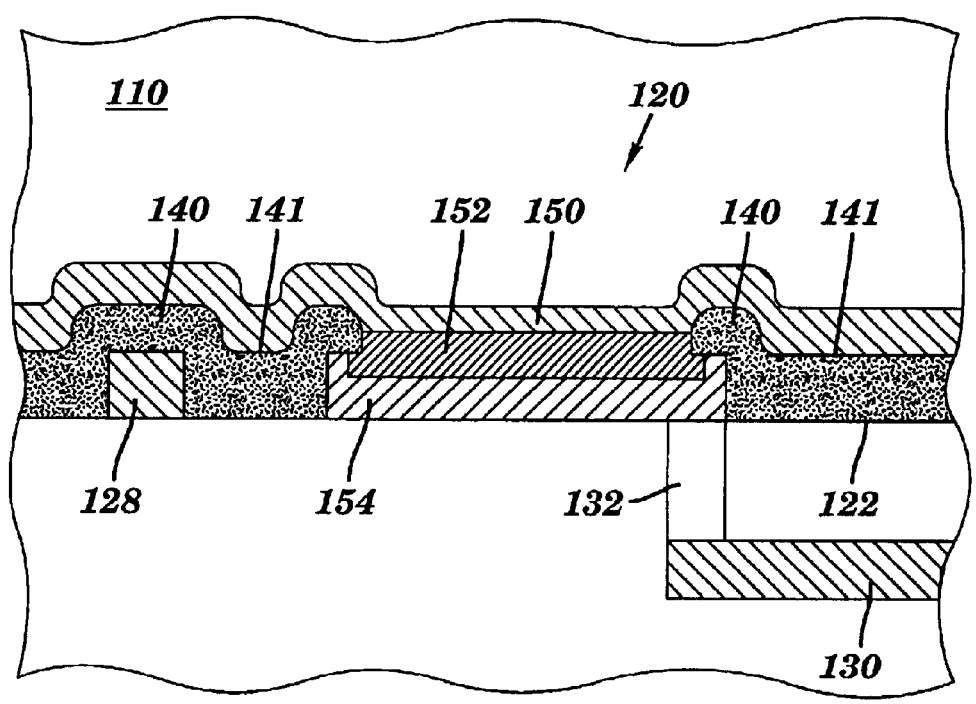
FIG. 14 depicts FIG. 13 after an annealing step forms a metallic layer.

Following annealing, the unalloyed top portion 156 in FIG. 14 of the second metal layer 150 (see FIG. 13) is removed so as to leave the metallic layer 152 in FIG. 14 exposed to the atmosphere 110, as well as to leave the optional dielectric layer 140 exposed to the atmosphere 110, as shown in FIG. 15. This removal of second metal may be accomplished by any feasible process, such as using a wet etch solution, as described supra in connection with FIG. 6.

The metallic layer 152 created by the annealing process covers and protects the unalloyed bottom portion 154 of the metal layer 124 (see FIG. 13) from corrosive attack by the atmosphere 110 and provides a conductive, corrosion-resistant interface for subsequent wirebonding and C4 interconnect. Thus, the annealing process generates the electrically conductive, corrosion resistant pad of the present invention.

Figure 16:
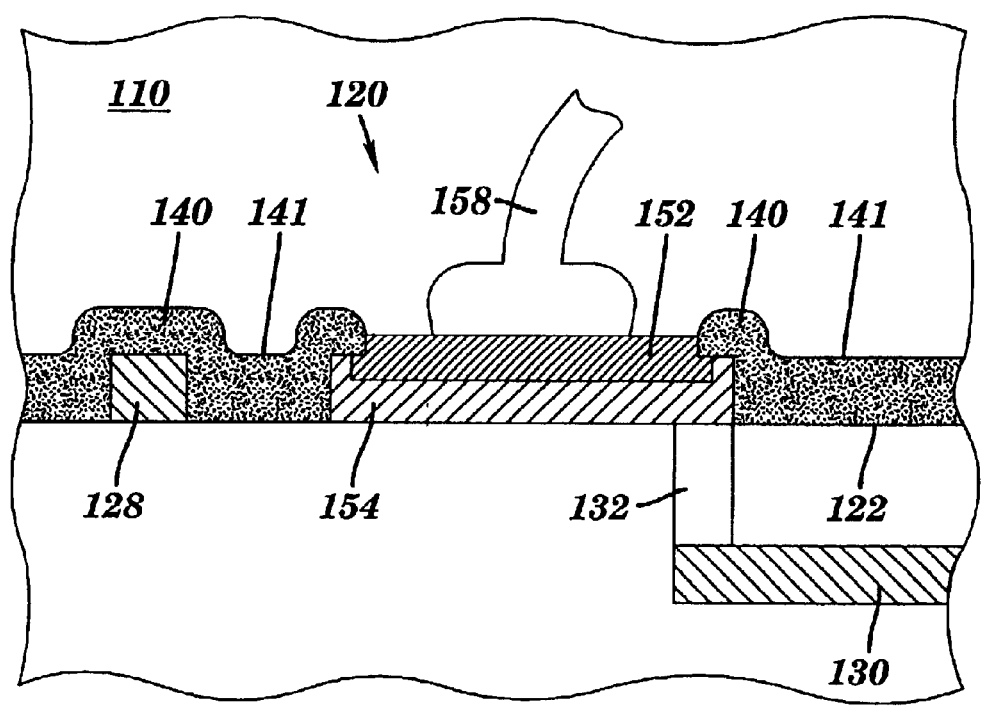
FIG. 16 depicts FIG. 15 after a wirebond is attached to the metallic layer.

Standard processing may follow removal of the unalloyed top portion 156 of the second metal layer, included dicing and packaging of the substrate, as well as attaching wirebond or C4 interconnect to the metallic layer of the corrosion-resistant conductive pad. FIG. 16 illustrates a wirebond 158 attached to the metallic layer 152. A C4 interconnect may be substituted for the wirebond 158 in FIG. 16, such as the C4 solder ball 59 shown in FIG. 7B.

Figure 17:
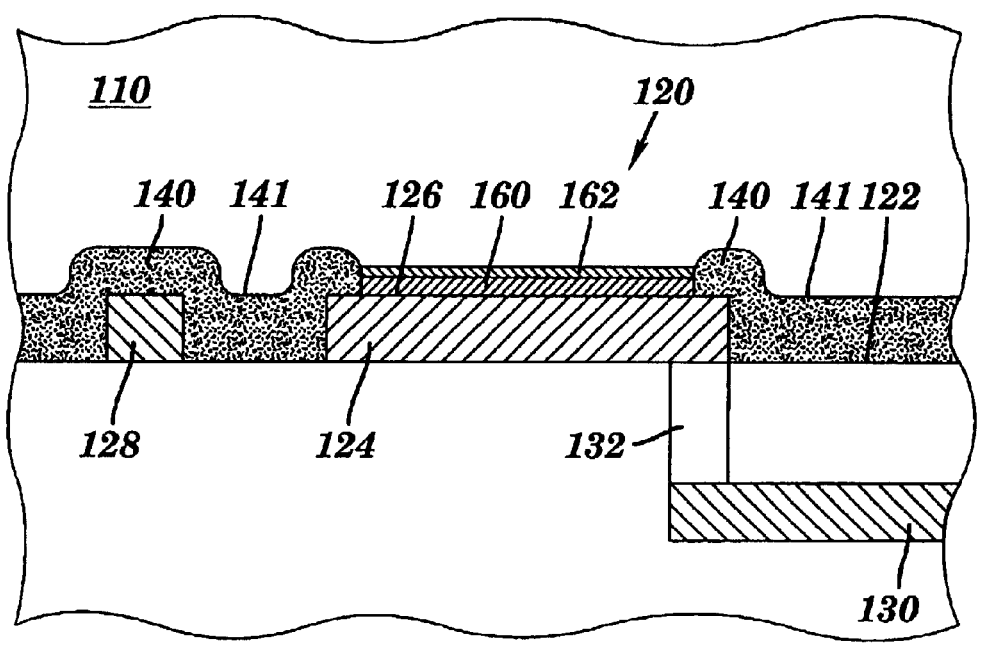
FIG. 17 depicts FIG. 12 after a metallic layer, covered by an optional thin film, is electroless plated on the metal layer.

The electroless plating method of the present invention starts with depositing a metallic layer on the initially exposed surface 126 of the metal layer 124 of FIG. 12 by electroless plating, which is indicated as metallic layer 160 in FIG. 17. The electroless plating involves immersing the substrate 120 into an aqueous solution of electrolyte having metal ions, wherein the metal ions deposit onto the metal layer 124, but do not deposit onto the optional dielectric layer 140 or to non-metallic portions of the top surface 122 of the substrate 120. Any suitable electrically conductive, corrosion-resistant metal or alloy may be electroless plated to form the metallic layer 160. Suitable metals for forming the metallic layer 160 include nickel, palladium, and gold. Suitable alloys for forming the metallic layer 160 include nickel-phosphorus, cobalt-phosphorus, and cobalt-tungsten-phosphorus. The metallic layer 160 deposited on the metal layer 124 by the electroless plating covers and protects the metal layer 124 from corrosive attack by the atmosphere 10 and provides a conductive, corrosion-resistant interface for subsequent wirebonding and C4 interconnect. An optional electroless plating of a thin film 162 of a suitable metal, such as gold or palladium, on the metallic layer 160 could be implemented to provide additional corrosion resistance. The optional thin film 162 would also improve wirebonding capability by inhibiting formation of an oxide of the metal or alloy of the metallic layer 160, since any such formed oxide may degrade the quality of subsequent wirebonding. The metallic layer 160 may be formed from a suitable metal (e.g., gold) that is the same metal of which the optional thin film is comprised. Thus, the electroless plating generates the electrically conductive, corrosion resistant pad of the present invention.

Figure 18:
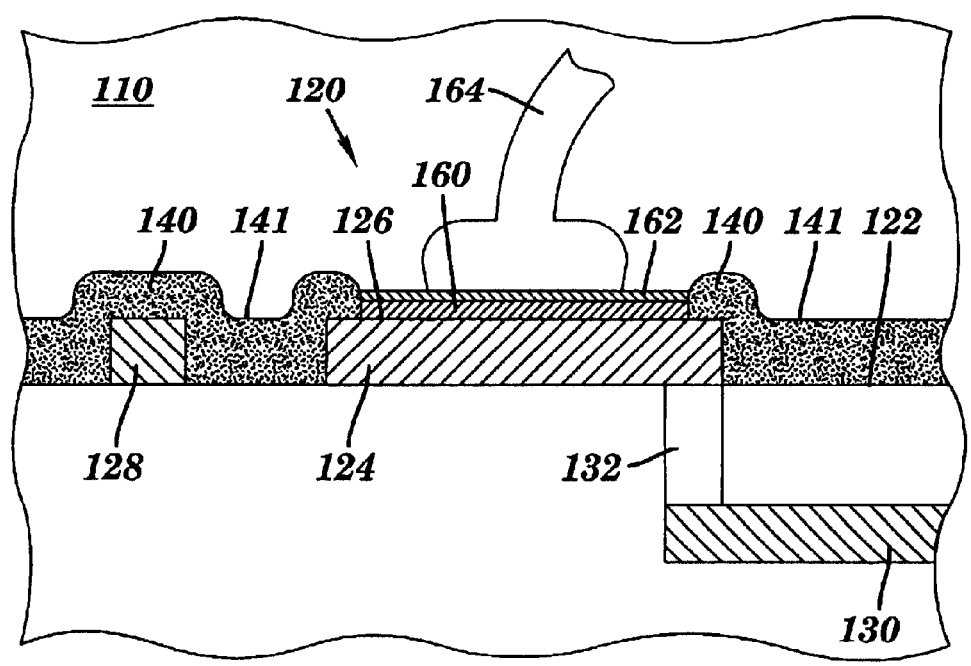
FIG. 18 depicts FIG. 17 after a wirebond is attached to the thin film.

Standard processing may follow the electroless plating, included dicing and packaging of the substrate as well as attaching wirebond or C4 interconnect to the metallic layer, or to the optional thin film, of the corrosion-resistant conductive pad. FIG. 18 illustrates a wirebond 164 attached to the optional thin film 162. If the optional thin film 162 were not present, the wirebond 164 would be attached to the metallic layer 160. A C4 interconnect may be substituted for the wirebond 164 in FIG. 18, such as the C4 solder ball 59 shown in FIG. 7B.

Figure 19:
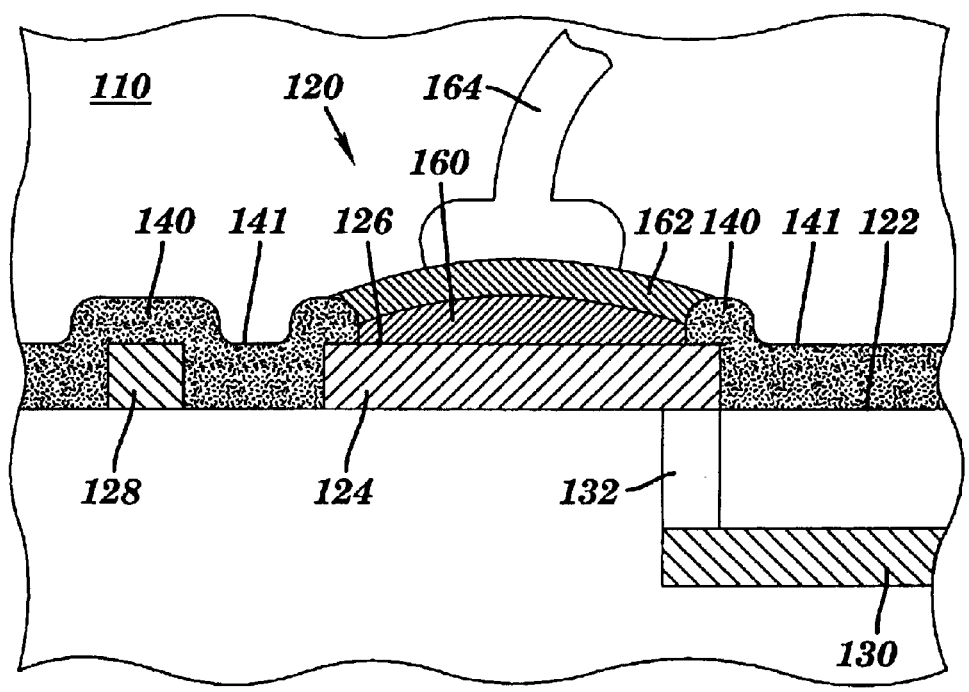
FIG. 19 illustrates FIG. 18 with the top surface of the thin film above the top surface of the dielectric layer.

Although FIGS. 17–18 show the metallic layer 160 and the optional thin film 162 as being totally below the top surface 141 of the dielectric layer 140, a portion of the metallic layer 160 and/or the thin film 162 could be above the top surface 141 of the dielectric layer 140. FIG. 19 illustrates FIG. 18 with the modification that the top surface 163 of the thin film 162 is above the top surface 141 of the dielectric layer 140. It is also possible for the top surface 161 of the metallic layer 160 in FIG. 19 to be above the top surface 141 of the dielectric layer 140, with or without the optional thin film 162.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A process for forming a conductive pad on a substrata, comprising the steps of:

providing the substrate having a metal layer with an initially exposed surface that is approximately coplanar with a top surface of the substrate, wherein the metal layer comprises a first metal, wherein the substrate has an internal wiring layer that is electrically coupled to the metal layer;

electrolessly plating an electrically conductive and corrosion resistant metallic layer on the initially exposed surface, wherein the metallic layer comprises a metal substance from the group consisting of a second metal, an alloy, and combinations thereof, and wherein the conductive pad comprises the metallic layer; and depositing an electrically conductive and corrosion resistant thin film on the metallic layer by electroless plating, wherein the conductive pad further comprises the thin film.

2. The process of claim 1, wherein the second metal is selected from the group consisting of nickel, palladium, and gold, and wherein the alloy is selected from the group consisting of nickel-phosphorus, cobalt-phosphorus, and cobalt-tungsten-phosphorus.

3. The process of claim 1, wherein the thin film includes a third metal selected from the group consisting of gold and palladium.

4. The process of claim 1, wherein the providing step includes forming a dielectric layer on a top surface of the substrate, such that an opening in the dielectric layer reveals the initially exposed surface of the metal layer.

5. The process of claim 1, further comprising attaching an interconnect to the metallic layer, wherein the interconnect is selected from the group consisting a wirebond interconnect and a C4 interconnect.

6. A process for forming a conductive pad on a substrate, comprising the steps of:

providing the substrate having a metal layer with an initially exposed surface that is not coplanar with a top surface of the substrate, wherein the metal layer comprises a first metal, wherein the substrate has an internal wiring layer that is electrically coupled to the metal layer;

electrolessly plating an electrically conductive and corrosion resistant metallic layer on the initially exposed surface, wherein the metallic layer comprises a metal substance from the group consisting of a second metal, an alloy, and combinations thereof, and wherein the conductive pad comprises the metallic layer; and depositing an electrically conductive and corrosion resistant thin film on the metallic layer by electroless plating, wherein the conductive pad further comprises the thin film.

7. The process of claim 6, wherein the second metal is selected from the group consisting of nickel, palladium, and gold, and wherein the alloy is selected from the group consisting of nickel-phosphorus, cobalt-phosphorus, and cobalt-tungsten-phosphorus.

8. The process of claim 6, wherein the thin film includes a third metal selected from the group consisting of gold and palladium.

9. The process of claim 6, wherein the providing step includes forming a dielectric layer on a top surface of the substrate, such that an opening in the dielectric layer reveals the initially exposed surface of the metal layer.

10. The process of claim 6, further comprising attaching an interconnect to the metallic layer, wherein the interconnect is selected from the group consisting a wirebond interconnect and a C4 interconnect.

* * * * *